United States Patent [19]

Wakabayashi et al.

[11] Patent Number: 5,404,366
[45] Date of Patent: Apr. 4, 1995

[54] NARROW BAND EXCIMER LASER AND WAVELENGTH DETECTING APPARATUS

[75] Inventors: Osamu Wakabayashi; Masahiko Kowaka; Yukio Kobayashi, all of Kanagawa, Japan

[73] Assignee: Kabushiki Kaisha Komatsu Seisakusho, Tokyo, Japan

[21] Appl. No.: 194,803

[22] Filed: Feb. 14, 1994

Related U.S. Application Data

[63] Continuation of Ser. No. 793,339, Jan. 13, 1992, abandoned.

[30] Foreign Application Priority Data

Jul. 14, 1989 [JP] Japan ................................ 1-181680
Aug. 11, 1989 [JP] Japan ................................ 1-208762

[51] Int. Cl.$^6$ .............................................. H01S 3/13
[52] U.S. Cl. ...................................... 372/29; 372/57; 372/102; 372/108
[58] Field of Search ............... 372/102, 57, 106, 19, 372/20, 92, 108

[56] References Cited

U.S. PATENT DOCUMENTS

| 3,775,699 | 11/1973 | Cassels ................... | 372/19 |
| 4,823,354 | 4/1989 | Znotins et al. . | |
| 4,873,692 | 10/1989 | Johnson et al. ............ | 372/102 |
| 4,905,243 | 2/1990 | Lokai et al. . | |
| 4,914,662 | 4/1990 | Nakatani et al. ........... | 372/29 |
| 4,936,665 | 6/1990 | Whitney ..................... | 359/571 |
| 4,942,583 | 7/1990 | Nazarathy et al. ......... | 372/102 |
| 4,947,398 | 8/1990 | Yasuda et al. .............. | 372/29 |
| 4,985,898 | 1/1991 | Furuya et al. .............. | 372/57 |
| 4,991,178 | 2/1991 | Wanigal ...................... | 372/57 |

Primary Examiner—Léon Scott, Jr.
Attorney, Agent, or Firm—Diller, Ramik & Wight

[57] ABSTRACT

A narrow band excimer laser and a wavelength detecting apparatus are suitable for use as a light source of a reduction projection aligner of a semiconductor device manufacturing apparatus. In the excimer laser, the ruling direction and the beam expanding direction of a prism beam expander are made substantially coincide with each other, and a polarizing element causing selective oscillation of a linearly polarized light wave substantially parallel with the beam spreading direction of a prism beam expander is contained in a laser cavity. A window at the front or rear side of a laser chamber is disposed such that the window make a Brewster's angle with respect to the axis of the laser beam in a plane containing the beam expanding direction of the prism expander and the laser beam axis. An anti-reflection film which selectively prevents reflection of a polarized light component substantially parallel to the direction of beam expanding of a prism beam expander is coated on one surface of a prism that constitutes the prism beam expander. The wavelength detecting apparatus is constructed to input a reference light and a light to be detected upon the etalon. The light transmitting through the etalon is condensed to focus on a light detector for detecting the wavelength of the laser beam based on interference fringe detected by the light detector.

19 Claims, 12 Drawing Sheets

NARROW BAND EXCIMER LASER AND WAVELENGTH DETECTING APPARATUS

This application is a continuation of application Ser. No. 07/793,339, filed Jan. 13, 1992, now abandoned.

TECHNOLOGICAL FIELD

This invention relates to a narrow band excimer laser and a wavelength detection device, and more particularly to a narrow band excimer laser suitable for a light source of a reduction projection aligner for use in manufacturing semiconductors.

BACKGROUND ART

Attention has been paid to the use of an excimer laser as a light source of reduction projection aligner (hereinafter called a stepper) for manufacturing semiconductor devices. This is because the excimer laser may possibly extend the light exposure limit to be less than (0.5 μm since the wavelength of the excimer laser is short (for example the wavelength of KrF laser is about 248.4 nm), because with the same resolution, the focal depth is greater than a g line or an i line of a mercury lamp conventionally used, because the numerical aperture (NA) of a lens can be made small so that the exposure region can be enlarged and large power can be obtained, and because many other advantages can be expected.

An excimer laser utilized as a light source of the stepper is required to have a narrow bandwidth with a beam width of less than 3 pm as well as a large output power.

A technique of narrowing the bandwidth of the excimer laser beam is known as the injection lock method. In the injection lock method, wavelength selecting elements (etalon, diffraction grating, prism, etc.) are disposed in a cavity of an oscillation stage so as to generate a single mode oscillation by limiting the space mode by using a pin hole and to injection synchronize the laser beam in an amplification stage. With this method, however, although a relatively large output power can be obtained, there are such defects that misshots occur, that it is difficult to obtain 100% locking efficiency, and the spectrum purity degrades. Furthermore, in this method, the output light beam has a high degree of coherency so that when the output light beam is used as a light source of the reduction type projection aligner, a speckle pattern generates. Generally it is considered that the generation of speckle pattern depends upon the number of space transverse modes. When the number of space transverse modes contained in the laser light is small, the speckle pattern becomes easy to generate. Conversely, when the number of the space transverse modes increases, the speckle pattern becomes difficult to generate art. The injection lock method described above is a technique for narrowing the bandwidth by greatly decreasing the number of space transverse modes. Since generation of speckle pattern causes a serious problem, this technique can not be adopted in the reduction projection aligner.

Another projection technique for narrowing the bandwidth of the excimer layer beam is a technique utilizing a air gap etalon acting as a wavelength selective element. A prior art technique utilizing the air gap etalon was developed by AT & T Bell Laboratory wherein an air gap etalon is disposed between the front mirror and a laser chamber of an excimer laser device so as to narrow the bandwidth of the excimer laser. This system, however, cannot obtain a very narrow spectral bandwidth. In addition there are problems in that the power loss is large due to the insertion of the air gap etalon. Further, it is impossible to greatly increase the number of the space transverse modes. Furthermore, the air gap etalon has a problem of poor durability.

Accordingly, an excimer laser device has been proposed wherein a relatively high durable diffraction grating is used as the wavelength selective element.

In the excimer laser having a diffractive grating which acts as a wavelength selective element, a pin hole is provided in a resonator (laser cavity) to reduce the spread angle of the beam in the grating. Alternatively, a beam expander is provided to expand the laser beam incident to the grating. For this beam expander, a prism expander utilizing a prism is typically been used.

The narrow band excimer laser used as the stepper must not only have a narrow bandwidth with a line width of less than 3 pm, but also must produce a large output.

In the construction in which a pin hole is disposed in a resonator, however, the output becomes greatly reduced and the number of space transverse modes necessary for preventing generation of a speckle pattern decreases, so that such construction can not be used.

In the construction in which a prism beam expander is used, the expander must have a large magnifying power in order to narrow the line width.

However, when the magnifying power of the prism beam expander becomes large, the incident angle of the laser beam to a prism of the prism expander becomes large or it becomes necessary to increase the number of prisms, thereby increasing the loss. As a result, a large output cannot be produced.

Furthermore, where a narrow band excimer laser is used as the light source of a stepper, it is necessary to narrow the bandwidth of the output laser beam and then to control the wavelength of the output laser beam whose bandwidth has been narrowed to a stable condition at a high accuracy.

A monitor etalon has been used for measuring the line width of the output beam and for detecting the wavelength. The monitor etalon is constituted by an air gap etalon wherein a pair of partial reflective mirrors are disposed to confront each other with a predetermined air gap there-between. The transmissive wavelength of this air gap etalon is expressed by the following equation $$m\lambda = 2nd \cdot \cos\theta$$

where m represents the order, d the partial mirrors spacing, n the refractive index of the medium the partial reflective mirrors, and $\theta$ an angle between the normal of the etalon and the axis of the incident light.

This equation shows that where n, d and m are constant, as the wavelength varies, the angle $\theta$ changes. The monitor etalon detects the wavelength of the beam by utilizing those characteristics. In the monitor etalon described above, when the pressure in the air gap and the ambient temperature vary, the angle $\theta$ varies even when the wavelength is constant. Accordingly, where the monitor etalon is used for detecting the wavelength, the pressure in the air gap and the ambient temperature are controlled to be constant.

However, it is difficult to precisely control the pressure in the air gap and the ambient temperature. Therefore, it is impossible to detect the absolute wavelength at a high accuracy.

For this reason, apparatus has been proposed wherein the beam to be detected is inputted to the monitor etalon together with a reference beam having a known wavelength, and the wavelength of the beam is detected by detecting a wavelength of the beam relative to the reference beam.

In this apparatus, a light beam transmitting through the monitor etalon is directly inputted to a beam detector such as CCD image sensor.

However, in this apparatus, since the output of the monitor etalon is directly inputted to the beam detector, the beam to be detected and the reference beam cannot be inputted to the beam detector with a sufficient beam quantity, and an interference fringe cannot be formed on the beam detector.

Accordingly, it is an object of this invention to provide a novel narrow band excimer laser of the type using a prism beam expander and a diffraction grating as a band-narrowing element capable of preventing increase of loss even when the magnifying power of the prism expander is increased.

Another object of this invention is to provide a novel wavelength detecting apparatus of a narrow band excimer laser capable of inputting a reference beam and a beam to be detected into a beam detector with a sufficient quantity and capable of detecting the interference fringes of both beams at a high accuracy.

DISCLOSURE OF THE INVENTION

According to one aspect of this invention, there is provided a narrow band oscillation excimer laser comprising a prism beam expander and a diffractive grating which are used as a bandwidth narrowing element, the ruling direction of the grating and the beam spreading direction of the prism beam expander being substantially coincided with each other; and selective oscillation means for selectively oscillating a linearly polarized wave which is substantially parallel with the beam expanding direction of the prism beam expander. The selective oscillation means may be constructed by a polarizing element disposed in the laser cavity.

The selective oscillation means may be constructed by a window provided on a rear side or a front side of the laser chamber in such a manner that the window is inclined with a Brewster's angle with respect to the optical axis of the laser beam in a plane containing the beam expanding direction of the prism expander and the optical axis of the laser beam.

The selective oscillation means may include a prism beam expander in which one surface of a prism is coated with a reflection preventive film for selectively preventing a reflection of a polarized component which is parallel with the beam expanding direction of the prism beam expander.

By selectively oscillating a linearly polarized wave which is substantially parallel with the beam expanding direction of the prism beam expander, the loss can be reduced even though the incident angle to the prism is large or the number of the prisms is increased. This is because a linearly polarized wave parallel with the beam expanding direction of the prism beam expander has a large transmissivity even the incident angle to the prism is large. With this construction, the narrow band laser device can generate a large output with a small spectrum line width.

According to the other aspect of this invention there is provided a wavelength detecting apparatus for use in a narrow band oscillation excimer laser comprising an etalon, light incidence means for projecting a reference light generated by a source of reference light and a laser beam to be detected upon the etalon; light condensing means for condensing light passed through the etalon; light detecting means disposed in a rear side focal plane of the light condensing means for detecting an interference fringe of light condensed by the light condensing means.

The reference light and the light to be detected are passed through the light condensing means, and then focused on the detection surface of the light detecting means disposed on the focal plane of the light condensing means.

BEST MODE FOR CARRYING OUT THE INVENTION

The embodiments of this invention will now be described with reference to the accompanying drawings.

Figure 1:
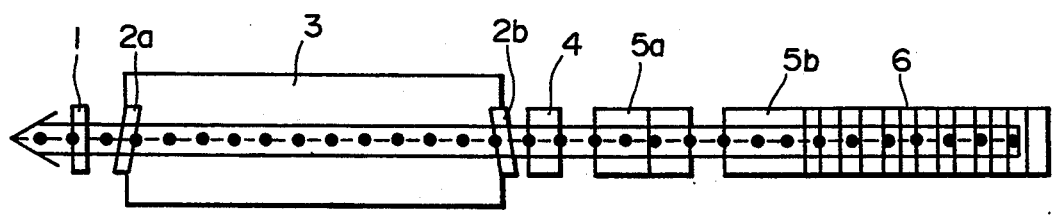
FIG. 1(a) is a plan view showing one embodiment of a narrow band excimer laser according to this invention.
FIG. 1(b) is a side view of the embodiment shown in FIG. 1(a)
Figure 1:
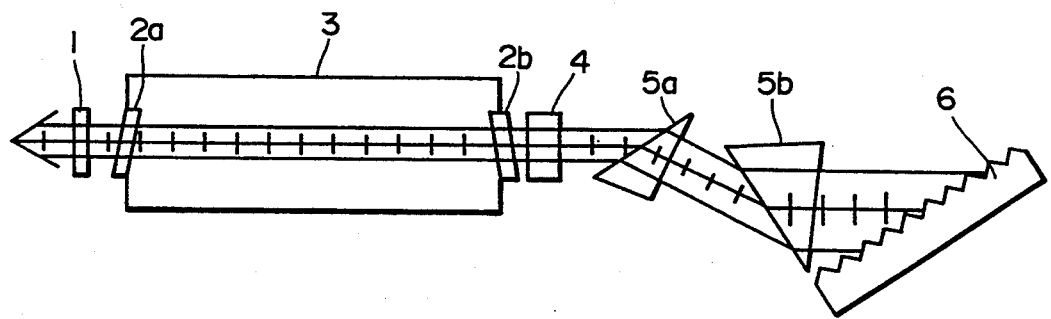

The narrow band excimer laser shown in FIGS. 1(a) and 1(b) comprises a front mirror 1, and a grating 6 acting as a rear mirror and a wavelength selective element. Between the front mirror 1 and the grating 6, a laser chamber 3, a polarizing element 4, and two prisms 5a and 5b acting as a beam expander (prism beam expander) are provided. Thus, a laser chamber or cavity is constructed between the front mirror 1 and the grating 6.

The laser chamber 3 is filled with a laser gas containing KrF, etc. which can circulate in the chamber 3. For the purpose of exciting the laser gas, discharge electrodes (not shown) are provided in the laser chamber 3. Windows 2a and 2b are provided at both ends of the laser chamber 3 at predetermined angles.

The purpose of the grating 6 is to select a beam having a specific wavelength by utilizing diffraction of light beam. The grating 6 is provided with a number of grooves directed in the same direction. In this specification, the direction perpendicular to these grooves is termed a ruling direction. By changing the angle of the grating 6 with respect to an incident beam within a plane containing the ruling direction of the grating 6, a beam having a specific wavelength can be selected. In other words, the grating 6 reflects only a specific diffracted light in a predetermined direction (in this case, the direction of incident beam), the specific diffracted light corresponding to the angle of the grating with respect to the incident beam. As a consequence, a beam having a specific wavelength can be selected.

The prism beam expander including prisms 5a and 5b is disposed such that its beam expanding direction substantially coincides with the ruling direction of the grating 6. The grating 6 is irradiated by the laser beam expanded by the prism beam expander.

The polarizing element 4 selectively transmits only the polarized beam which is substantially parallel with the beam expanding direction of prism beam expander made up of prisms 5a and 5b. The polarizing element 4 may be constructed, for example, by a polarizing prism utilizing a birefringence material (crystal, calcite, etc.), A Brewster's dispersion prism, a glass substrate (quartz, CaF$_2$ or MgF$_2$), which is arranged at a Brewster's angle or a glass substrate coated such that it transmits a certain polarized light component.

With such construction, the apparatus shown in FIGS. 1(a) and 1(b) selectively oscillates a linearly polarized light wave parallel to the beam spreading direction by the prism beam expander made up of prisms 5a and 5b. The linearly polarized light wave parallel with the beam expanding direction of the prism beam expander has a large transmissivity even when the incident angle of the beam to the prism is large. Therefore, even when the magnifying power of the beam expander is made large for line-narrowing, the loss does not increase greatly. In other words, according to this invention, it is possible to construct a narrow band excimer laser with a small loss.

Figure 2:
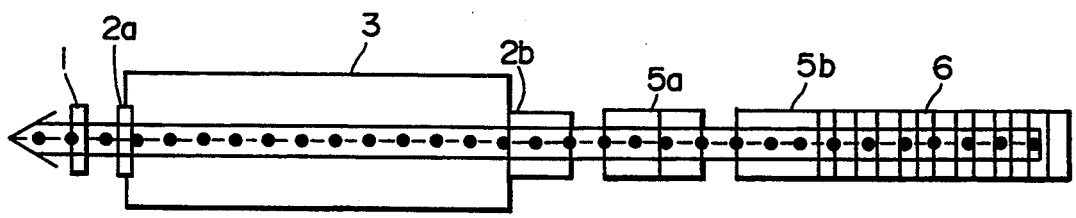
FIG. 2(a) is a plan view showing another embodiment of the narrow band excimer laser according to this invention.
FIG. 2(b) is a side view showing the another embodiment shown in FIG. 2(a)
Figure 2:
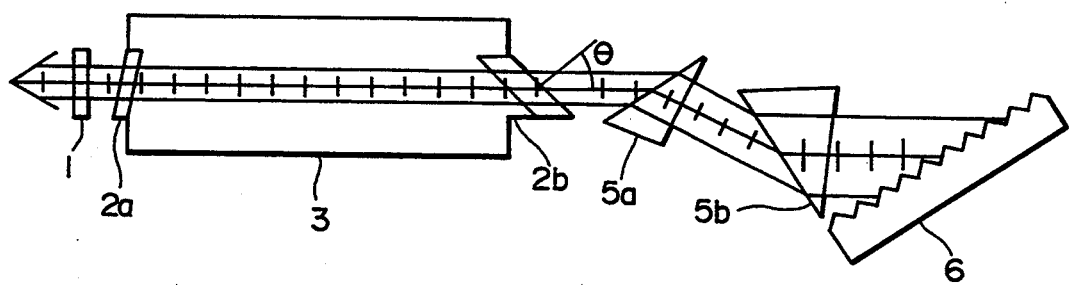

The modified embodiment of this invention shown in FIGS. 2(a) and 2(b) is constructed such that a specific linearly polarized light wave can be selected by a rear side window of the laser chamber 3. In this embodiment, the rear side window 2b of the laser chamber 3 makes substantially the Brewster's angle $\theta$ with respect to the beam expanding direction of the prism beam expander constructed by prisms 5a and 5b, in a plane including the beam expanding direction of the beam expander and the optical axis of the laser beam.

In the modification shown in FIGS. 2(a) and 2(b), only the rear side window 2b is set to make the Brewster's angle. However, it is possible to arrange both the rear side window 2b and the front side window 2a to make the Brewster's angle. It is also possible to set only the front side window 2a to make the Brewster's angle.

Figure 3:
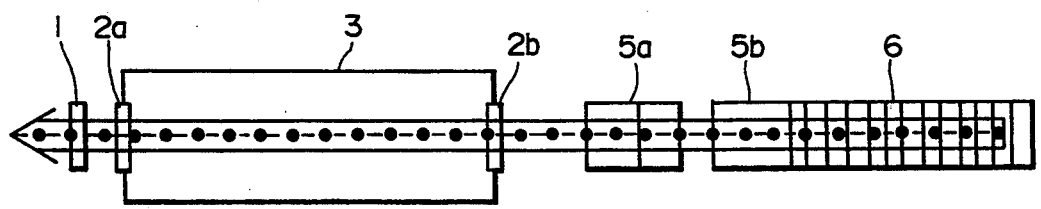
FIG. 3(a) is a plan view showing a still another embodiment of the narrow band excimer laser.
FIG. 3(b) is a side view of the embodiment shown in FIG. 3(a)
Figure 3:
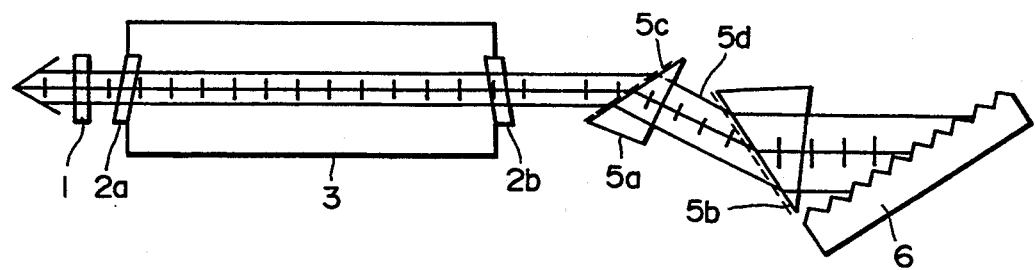

A still another embodiment shown in FIGS. 3(a) and 3(b) is constructed by coating the prisms 5a and 5b, which constitute the prism beam expander, with an anti-reflection coating film that selectively transmits only the polarized light component parallel to the beam expanding direction of the prism beam expander. In FIG. 3(b), portions 5c and 5b shown by dotted lines indicate these coated portions.

The coating can be applied to one beam transmitting surface of at least one prism. With this construction, even when the incident angle increases, the transmissivity is higher than 99%.

Figure 4:
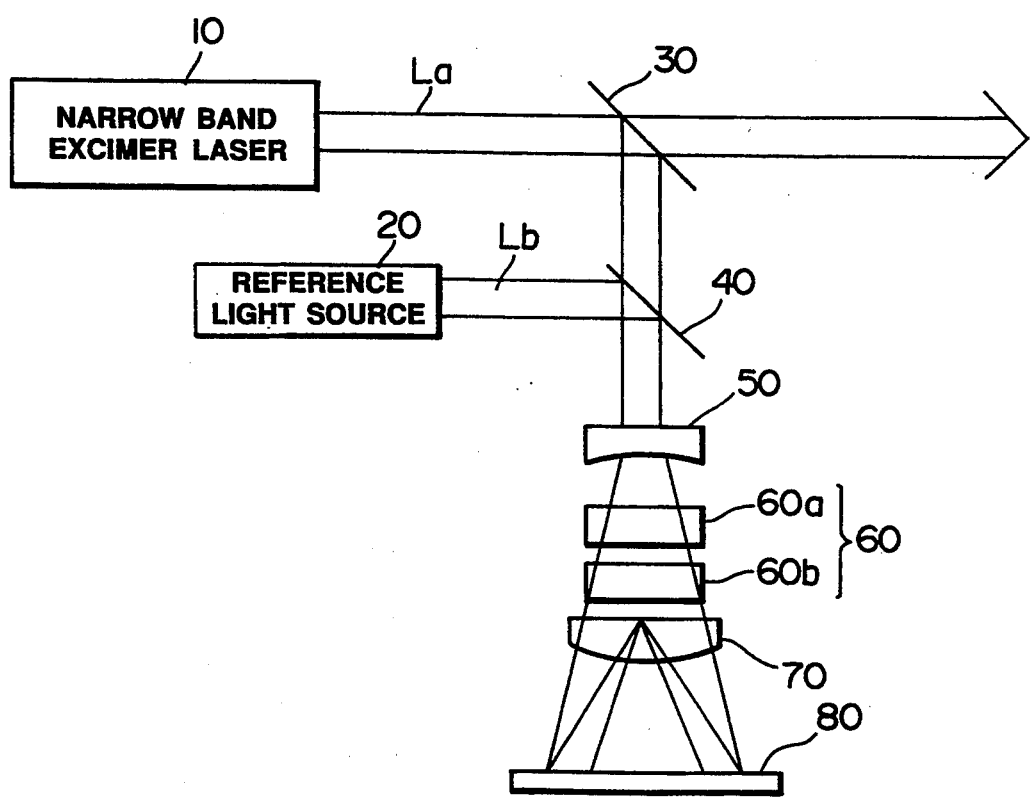
FIG. 4 is a diagrammatic representation showing one embodiment of the wavelength detecting apparatus for the narrow band excimer laser of this invention.

FIG. 4 shows one embodiment of a wavelength detecting apparatus for the narrow band excimer laser according to this invention. In this embodiment, as the beam to be detected, the output beam La of the narrow band excimer laser 10 is used, and as a reference light source 20, a He—Ne laser or an Ar laser or other types of laser is used. The reference laser beam generated by the reference light source 20 and the excimer laser beam have different wavelengths.

A part of the laser beam La outputted from the narrow band excimer laser 10 is sampled by a beam splitter 30, and this sampled beam is inputted to a beam splitter 40. The reference beam Lb generated by the reference light source 20 is inputted to the other surface of the beam splitter 40.

The beam splitter 40 transmits a part of the sampled beam La outputted from the beam splitter 30 and reflects a part of the reference beam Lb outputted by the reference beam source 20, thus combining the sampled beam with the reference beam. The combined beam outputted from the beam splitter 40 is spreaded by a concave lens 50, and the spread beam is inputted to an etalon 60.

The etalon 60 is constituted by two transparent plates 60a and 60b whose inner surfaces are made to act as partial reflecting mirrors. The wavelength of the beam transmitted through the etalon 60 varies corresponding to the angle of incident light to the etalon. Thus, the reflecting films are coated on the etalon plates in 2-wavelength coating so as to partially reflect both the reference beam Lb and the excimer laser beam La having different wavelengths from the reference beam Lb.

The beams transmitted through the etalon 60 are inputted to a condenser lens 70. The condenser lens 70 may be an achromatic lens corrected for color aberration. When the laser beam transmits through the achromatic condenser lens 70, the color aberration compensated.

The beam detector 80 is disposed at the focal point of the condenser lens 70 so that the light beam passed through the condenser lens 70 is focused on the beam detector 80. On the detecting surface of the beam detector 80 are formed a first interference fringe corresponding to the reference beam and a second interference fringe corresponding to the beam to be detected. Base on these first and second interference fringes, the beam detector 80 detects the relative wavelength of the beam to be detected with respect to the wavelength of the reference beam. Thus, the beam detector 80 can detect the absolute wavelength of a beam to be detected when the wavelength of the reference beam is known.

The beam detector 80 may be constituted by a one-dimensional or two-dimensional image sensor, a diode array or a position sensitive detector (PSD).

As above described, the beams are inputted to the etalon 60 after being spread with the concave lens 50, and the beams transmitted through the etalon 60 are focused on the beam detector 80 with the condenser lens 70. Therefore, a sufficient quantity of beams are inputted to the beam detector 80 and the interference fringes of both beams can be clearly formed.

Figure 5:
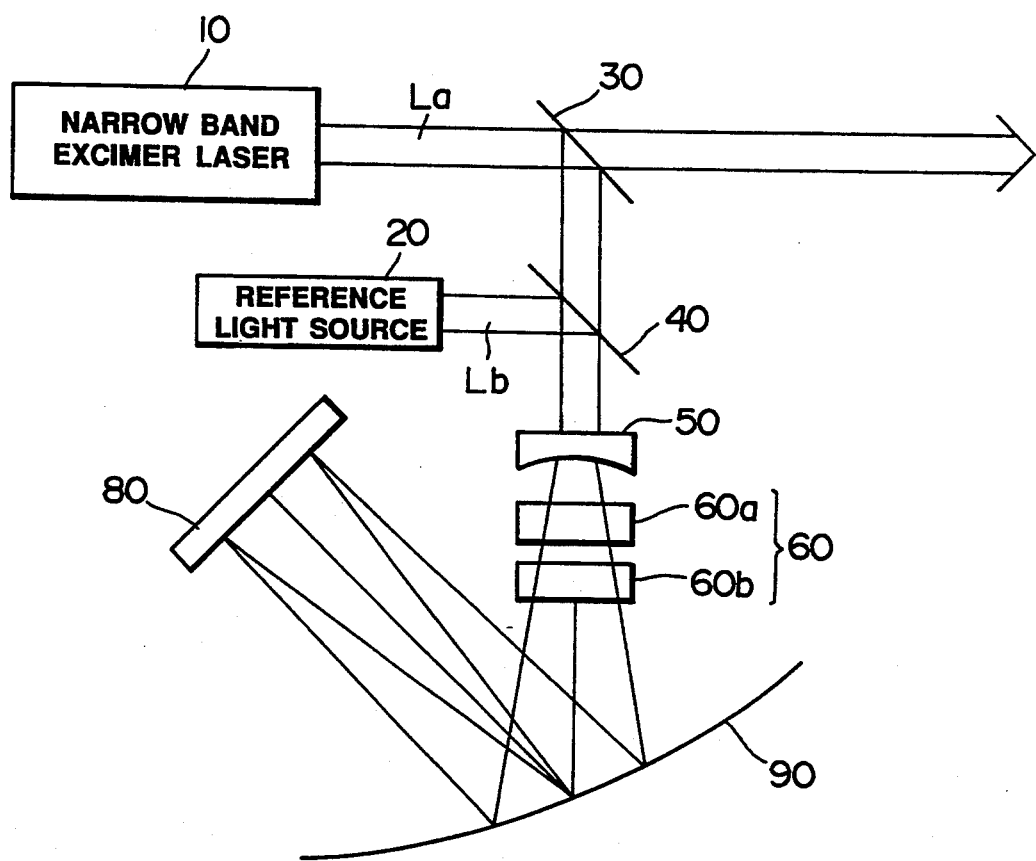
FIG. 5 is a diagrammatic representation showing another embodiment of the wavelength detecting apparatus for the narrow band excimer laser using a beam condensing mirror.

FIG. 5 illustrates another embodiment of the wavelength detecting apparatus of the narrow band excimer laser according to this invention. For convenience of description, elements doing the same performance are designated by the same reference numerals and characters in FIG. 5 and subsequent drawings.

In the embodiment shown in FIG. 5, instead of the achromatic condenser lens 70, such condenser mirror 90 as a concave mirror or an eccentric parabolic mirror is used. More particularly, a reference beam Lb and an excimer laser beam La are inputted to an etalon 60 through a concave lens 50, and the beam transmitted through the etalon 60 is reflected by the condenser mirror 90. The reflected light beam is inputted to the detecting surface of a beam detector 80 disposed at the focus of the condenser mirror 90. Since the condenser mirror 90 having a reflecting surface is used, there is no achromatic aberration so that it is possible to focus the interference fringes of the excimer laser beam La and the reference laser beam Lb at the same position, that is, on the beam detector 80 disposed at the focal point of the mirror 90.

In this embodiment shown in FIG. 5, it is possible to detect at a high accuracy the interference fringes of a sufficient light quantity by using the concave lens 50 and the condenser mirror 90 as in the previous embodiment.

Figure 6:
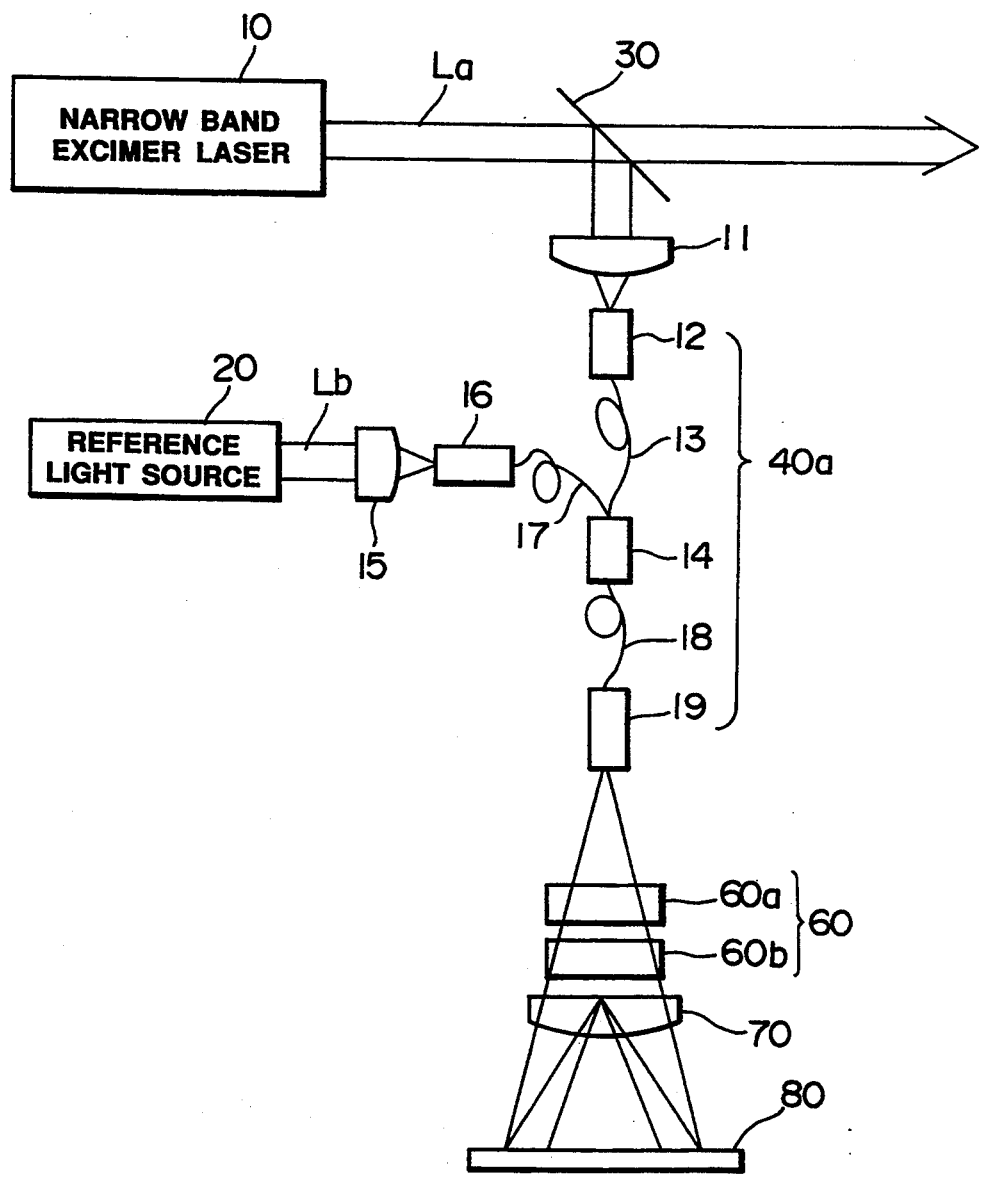
FIG. 6 is a diagrammatic representation showing still, another embodiment of the wavelength detecting apparatus for narrow band excimer laser using a converging type light filter.

FIG. 6 shows a still another embodiment of the wavelength detecting apparatus of the narrow band excimer laser according to this invention.

In this embodiment, the excimer laser beam La and the reference laser beam Lb are synthesized by using a synthesizer type optical fiber 40a. More particularly, the excimer laser beam La sampled by a beam splitter 30 is applied to a beam synthesizer 14 through a condenser lens 11, an optical fiber sleeve 12 and an optical fiber 13, while the reference laser beam Lb generated by the reference light source 20 is applied to the beam synthesizer 14 via condenser lens 15, an optical fiber sleeve 16 and an optical fiber 17. The beam synthesizer 14 synthesizes these two beams La and Lb, and the beam thus synthesized is inputted to an optical fiber 18, and the beam spread by a sleeve 19 is inputted to a monitor etalon 60. The beam transmitted through the monitor etalon 60 is focused on the beam detector 80 through an achromatic condenser lens 70.

In the embodiment shown in FIG. 6, the position of the interference fringe is not influenced by the position of the synthesizing type optical fiber 40a, but is solely determined by the positional relation among the etalon 60, the condenser lens 70 and the beam detector 80. Therefore, there is an advantage that the optical system can be adjusted easily, in addition to the advantages of the previous embodiments.

Although in the embodiment shown in FIG. 6, correction of the color aberration is performed by using the achromatic lens 70, this lens can be substituted by the concave mirror or the eccentric parabolic mirror 90 shown in FIG. 5.

Figure 7:
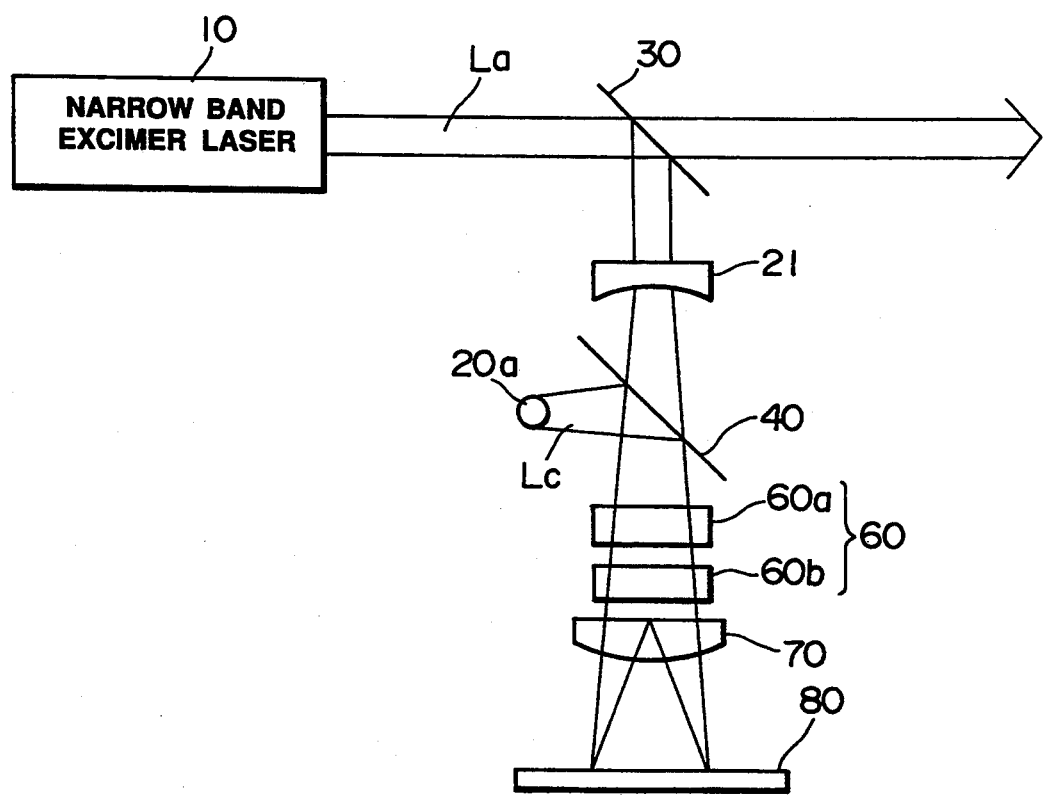
FIG. 7 is a diagrammatic representation showing a further embodiment of the wavelength detecting apparatus for the narrow band excimer laser using a lamp as a source of reference light.

FIG. 7 shows further embodiment showing the wavelength detecting apparatus of the narrow band excimer laser in which a plane light source, that is a lamp 20a is used as the reference light source. This lamp 20a may be a mercury lamp generating a reference light having a wavelength of 253.7 nm, for example. More particularly, the excimer laser beam La sampled by a beam splitter 30 is spread by a concave lens 21 and then applied to a beam splitter 40 which synthesizes the spread beam with the reference beam Lc from the mercury lamp 20. The synthesized beam is inputted to an etalon 60. The beam transmitted through the etalon 60 is focused on the beam detector 80 through an achromatic condenser lens 70.

In the embodiment shown in FIG. 7, the color aberration is corrected by using the achromatic condenser lens 70. However, this lens can be substituted by the concave mirror or the eccentric parabolic mirror 90 shown in FIG. 5.

Figure 8:
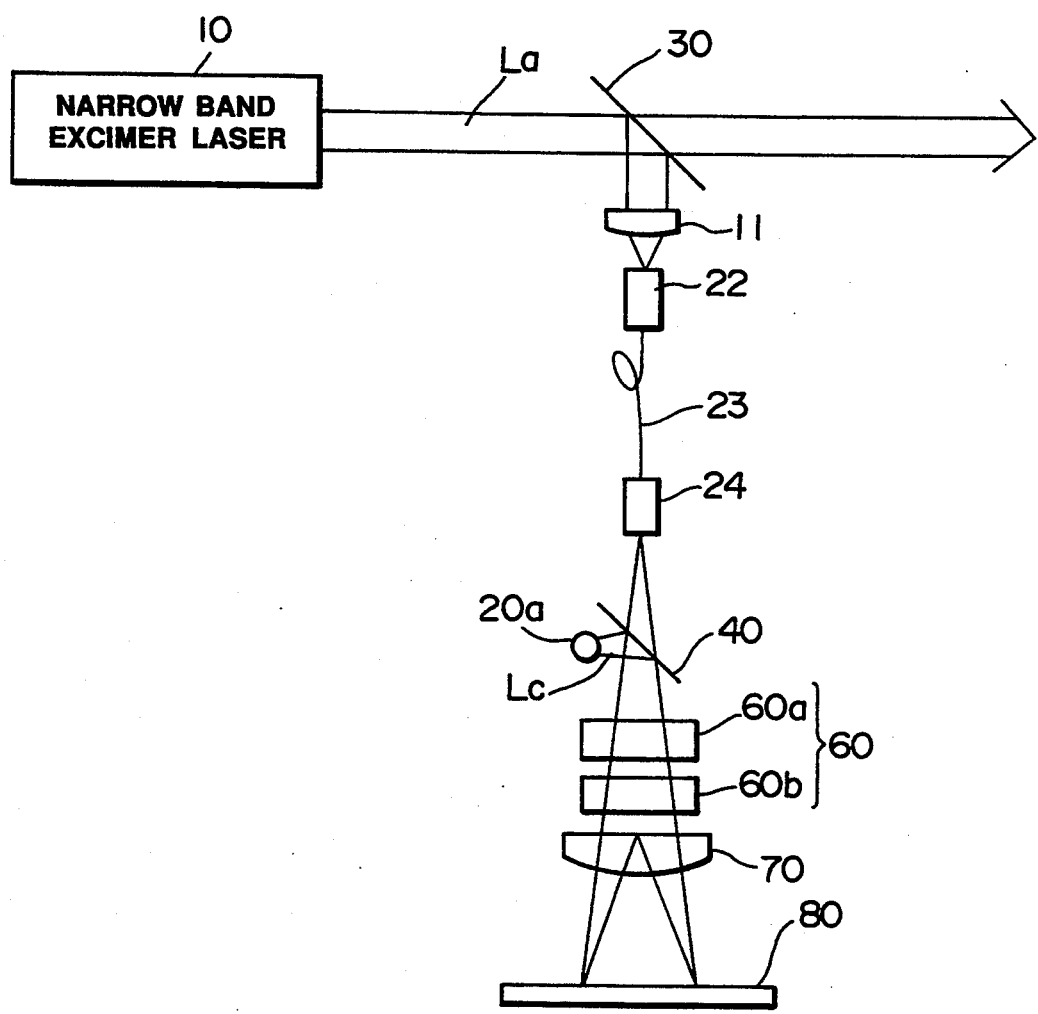
FIG. 8 is a diagrammatic representation showing a still of the wavelength detecting apparatus using a lamp and an optical fiber.

FIG. 8 illustrates yet another embodiment of the wavelength detecting apparatus of the narrow band excimer laser of this invention in which a mercury lamp 20a is used as the reference light source. In this embodiment, the excimer laser beam La is guided to a beam splitter 40 by using an optical fiber 23. More particularly, the excimer laser beam sampled by a beam splitter 30 is inputted to a sleeve 22 through a condenser lens 11. Thereafter, the beam is outputted from the sleeve 22 to a sleeve 24 through an optical fiber 23. The beam which is spread by passing through the sleeve 24 is applied to a beam splitter 40 where the beam is synthesized with the reference light beam Lc from the mercury lamp 20 and is then inputted to an etalon 60. The light beam transmitted through the etalon 60 is focused on a beam detector 80 via an achromatic condenser lens 70.

In the embodiment shown in FIG. 8, the achromatic condenser lens 70 may be substituted by a concave mirror or an eccentric parabolic mirror 90 shown in FIG. 5.

Figure 9:
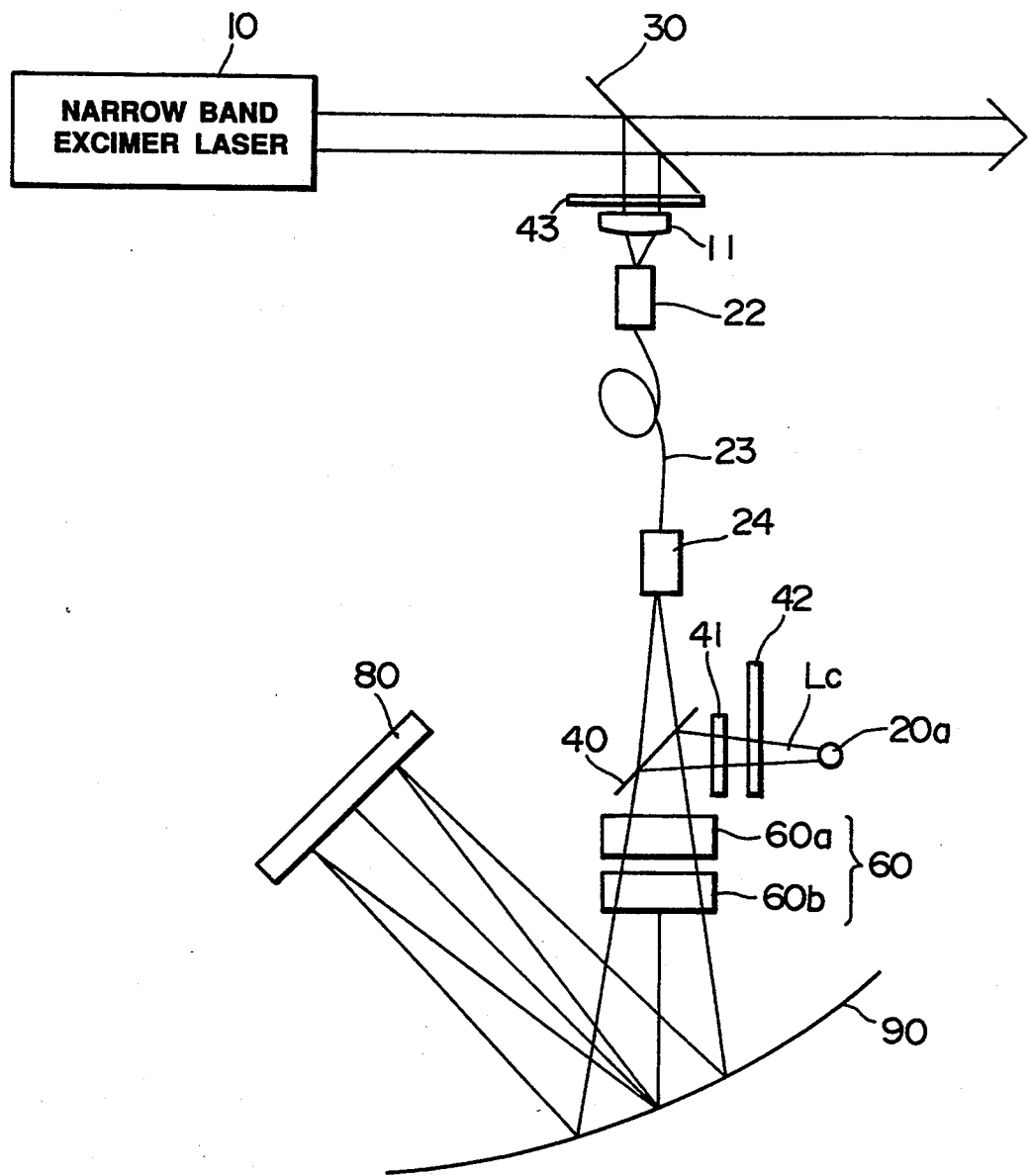
FIG. 9 is a diagrammatic representation showing another wavelength detecting apparatus for the narrow band excimer laser in which a shutter and a filter are inserted.

FIG. 9 shows another embodiment of the wavelength detecting apparatus of the narrow band excimer laser. In this embodiment, the achromatic condenser lens 70 in FIG. 8 is replaced with a condenser mirror 90 such as a concave mirror or an eccentric parabolic mirror. In addition, a filter 41, and shutters 42 and 43 are added.

More particularly, a filter 41 which selects only a light beam having a predetermined wavelength among the reference light beams Lc generated by the mercury lamp 20a is provided between a shutter 42 and a beam splitter 40. Thus, only the reference light beam having the predetermined wavelength is inputted to beam splitter 40. For example, where the apparatus is used as the wavelength detector of the beam (having a wavelength of 248.4 nm) generated by a KrF narrow band excimer laser, a mercury lamp is used as the lamp 20a, and an interference filter for a beam having a wavelength of 253.7 nm, which is close to that of the excimer laser, is used as the filter 16. Shutters 42 and 43 are provided for the purpose of independently detect the reference light beam and the light beam to be detected (the laser beam of excimer laser). For detecting the reference light beam (FIG. 11), the shutter 42 is opened and the shutter 43 is closed. For detecting the light beam to be detected (FIG. 12), the shutter 43 is opened and the shutter 42 is closed.

In this embodiment, the filter 41 is disposed between the beam splitter 40 and the shutter 42. However, the filter 41 may be disposed between the lamp 20a and the shutter 42. Furthermore, where the wavelengths of the reference light beam and of the beam to be detected are close to each other, and where the beam to be detected transmits through the filter 41, the filter 41 may be placed at a suitable position in the light path between the beam splitter 40 and the light beam detector 80.

Figure 11:
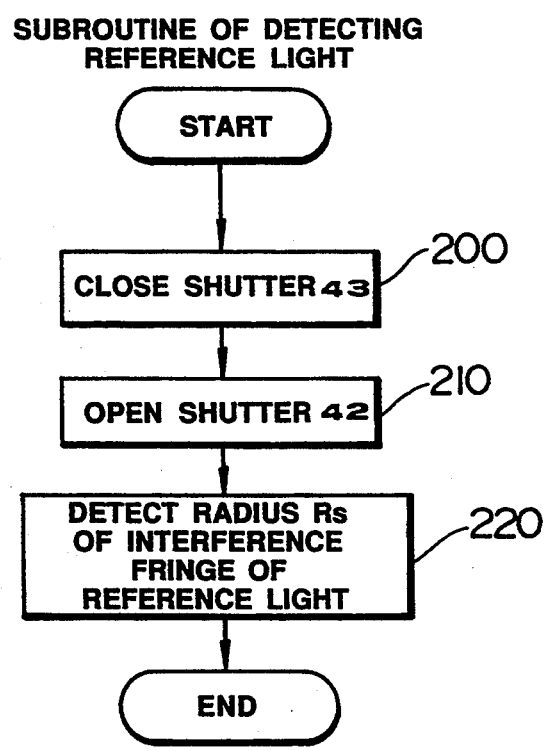
FIG. 11 is a flow chart showing and example of a reference light detecting subroutine.
Figure 12:
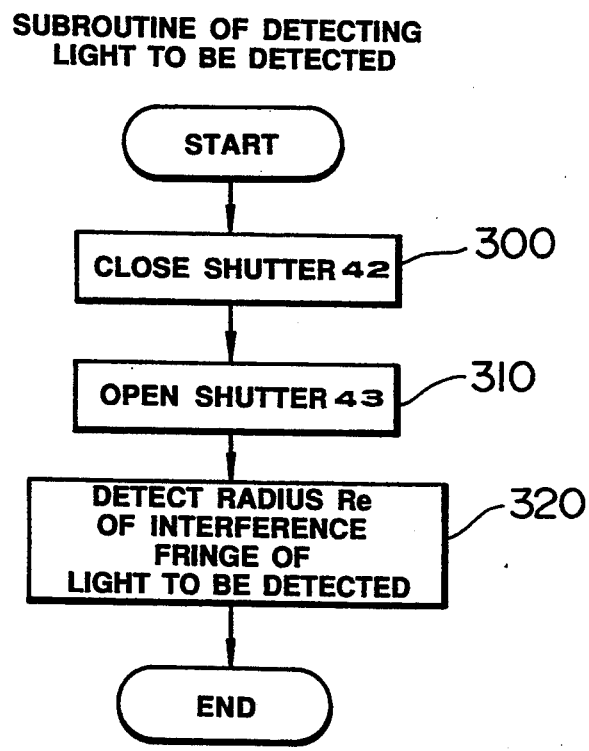
FIG. 12 is a flow chart showing one example of a light detecting subroutine.

The detecting operation of the reference light beam and the beam to be detected of this embodiment shown in FIG. 9 will now be described with reference to the flow charts shown in FIGS. 10-12.

Figure 10:
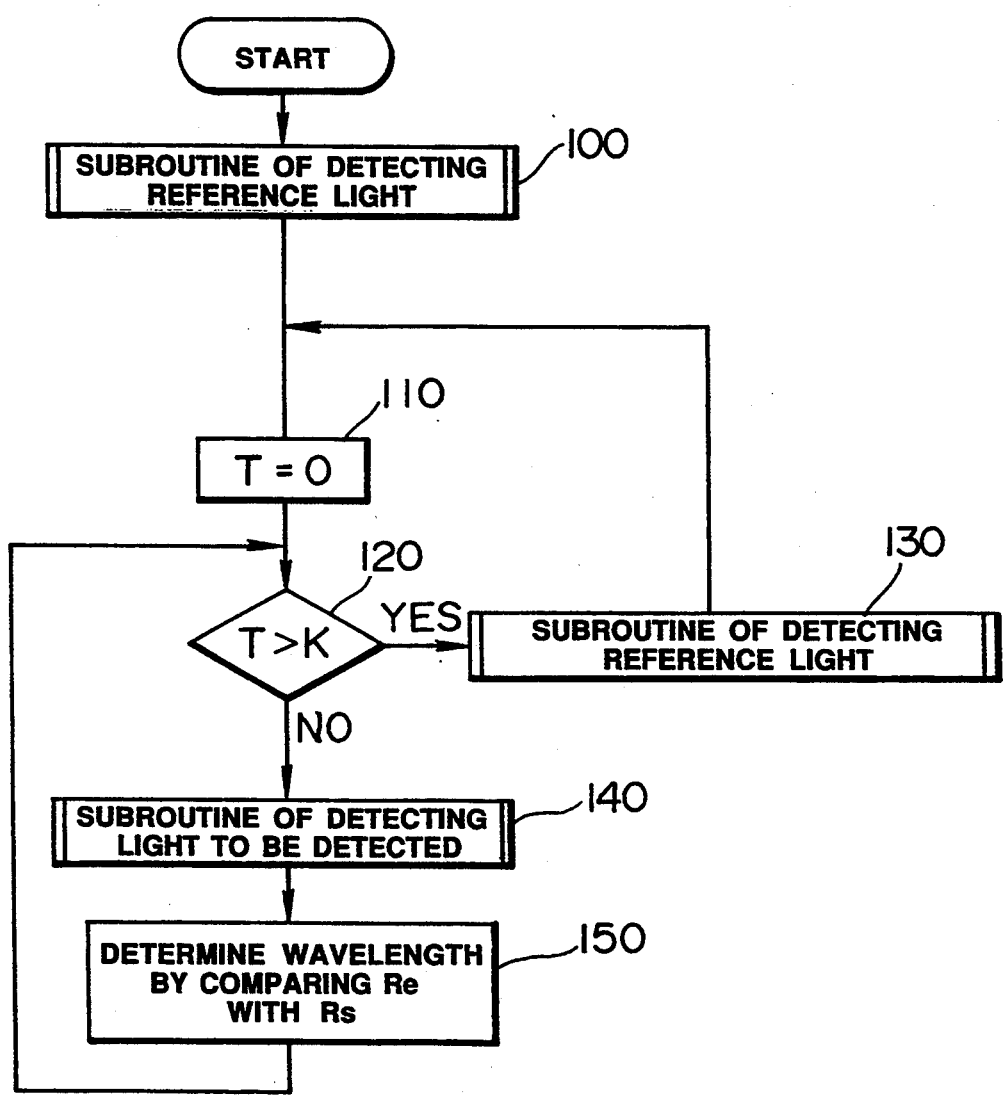
FIG. 10 is a flow chart showing one example of the main routine for detecting a wavelength when the wavelength detecting apparatus shown in FIG. 9 is used.

FIG. 10 shows the main routine for the wavelength detection. First, the reference light beam detection subroutine is executed at step 100. As shown in FIG. 11, in this subroutine, the shutter 43 on the side of the beam to be detected is closed while the shutter 42 on the side of the reference light beam is opened so as to input only the reference light beam Lc to the beam detector 80 via the etalon 60 at steps 200 and 210. Then, the radius Rs of the interference fringe of the reference beam formed on the beam detector 80 is detected and stored in a memory, not shown, at step 220.

Upon completion of this reference beam detection subroutine, the count value T of a timer, not shown, is cleared to zero at step 110. Then, at step 120, a judgement is made as to whether the count value T is larger than a predetermined preset time K (for example, several minutes). Where T<K, the detection subroutine for detecting the beam to be detected is executed at step 140. In this detection, subroutine, as shown in FIG. 12, by closing the shutter 42 on the side of the reference light beam and opening the shutter 43 on the side of the beam to be detected, only the beam La to be detected is applied to the beam detector 80 at steps 300 and 310. Then, the radius Re of the interference fringe of the beam to be detected formed on the surface of the beam detector 80 is detected at step 320.

Upon completion of the detection subroutine for detecting the beam to be detected, the radius Re determined by this subroutine is compared with the radius Rs which has been determined and stored in the previous reference beam subroutine so as to detect the absolute wavelength of the beam to be detected at step 150. Thereafter, the executions of steps 140 and 150 are repeated until a condition T>K is obtained.

When T>K at step 120, the reference beam detection subroutine shown in FIG. 11 is executed again and the stored data Rs is renewed by the radius Rs of the interference fringe of the reference beam determined by the subroutine. Then, after the count value T of the timer is cleared to zero, the subroutine for detecting the beam to be detected is executed again.

All processings described above are executed automatically.

More particularly, in the wavelength detection processing described above, where the wavelengths of the reference beam and the beam to be detected are close to each other, it is difficult to simultaneously detect the interference fringes of both beams. Therefore, the interference fringes are independently detected by using the shutters 42 and 43. Since the reference beam is relatively stable, it is advantageous to detect the interference fringe in a relatively long preset period K. In a case other than detecting the reference beam, it is designed that the beam to be detected is always detected. In other words, the detection period for the reference beam is set to be sufficiently longer than the detection period for the beam to be detected.

In this embodiment, the radius of an interference fringe is detected. However, the absolute wavelength of the beam to be detected can also be obtained by detecting the diameter or position of the interference fringe.

In the embodiments shown in FIGS. 4-9, when the light quantities of the reference beam and the beam to be detected are small so that the detection of the interference fringes is difficult, a collimator lens may be disposed in front of the etalon 60 so as to apply parallel light to the etalon, thus increasing the light quantity.

In the embodiments shown in FIGS. 4-9, the beam splitter 40 is disposed such that the beam to be detected is applied to the beam transmissive side while the reference beam is applied to the opposite side. However, their positional relationship may be reversed. Where the wavelengths of the reference beam and of the beam to be detected are close to each other, a partial reflection mirror may be used, whereas where the difference between wavelengths are large, a dichroic mirror may be used.

The embodiments described above are constituted by using an air gap etalon. However, it may be substituted by a solid etalon.

In the above described embodiments, the focused positions of the reference beam and of the beam to be detected are made to coincide with each other by correcting the color aberration of the condenser lens 70, or by using the condenser mirror 90. However, it may be so constructed that the condensing lens 70 or the beam detector 80 is disposed movable in the direction of the optical axis so as to correct the focused position.

Where the wavelengths of the reference beam and the beam to be detected are close to each other in the embodiments shown in FIGS. 4, 6, 7 and 8, a condenser lens whose color aberration is not corrected may be inserted between the etalon 60 and the beam detector 80.

In the embodiments shown in FIGS. 4, 5, and 7, the laser beam La is spread by the concave lens 50 or 21 and the spread laser beam is inputted to the etalon 60. However, the concave lens may be substituted with a convex lens. According to this modification the laser beam is condensed, at first by the convex lens and then spread. The spread beam is inputted to the etalon 60. Furthermore, instead of using the concave lens 50, a diffusion plate (e.g., a frosted glass) may be used.

FIELD OF APPLICATION IN INDUSTRY

As above described, in the narrow band excimer laser according to this invention, by substantially coinciding the ruling direction of the grating with the beam expanding direction of the prism beam expander and by providing selective oscillation means for selectively oscillating a linearly polarized light wave substantially parallel with the beam spreading direction of a prism beam expander, it becomes possible to greatly decrease the loss in the prism beam expander. For this reason, it becomes possible to narrow the spectrum line width and to obtain a large output.

Further, according to the wavelength detecting apparatus of the narrow band excimer laser of this invention, with a simple construction of providing a light condensing device on the rear side of an etalon, a sufficient quantity of light can be applied to a light detector. As a result, it becomes possible to form clear interference fringes on the light detector, thus enabling to detect the absolute wavelength of the beam to be detected at a high accuracy. Especially, by using an achromatic lens or a light condensing mirror as light condensing means, even when the wavelengths of the reference beam and that of the detected beam are not equal, the absolute wavelength can be accurately detected without constructing the optical system to be movable.

The narrow band excimer laser and the wavelength detecting apparatus of the excimer laser are especially suitable to use as a light source of a reduction projection aligner for use in manufacturing semiconductor devices.

What is claimed is:

1. A narrow band excimer laser comprising:
  a laser chamber adapted to be filled with a laser gas;
  a front mirror disposed in front of the laser chamber for reflecting one part of a laser beam outputted from the laser chamber and transmitting another part of the laser beam;
  a beam expander disposed behind the laser chamber for expanding the laser beam outputted from the laser chamber in a predetermined direction;
  a grating disposed behind the beam expander and having a plurality of grooves formed in a direction substantially perpendicular to a direction of beam expansion by the beam expander for selectively reflecting a laser beam having a desired wavelength among those of the laser beam expanded by the beam expander; and
  a polarizing element disposed between the laser chamber and the beam expander for converting the laser beam output from the laser chamber into a linear polarized light wave which is substantially parallel with the direction of beam expansion by the beam expander.

2. A narrow band excimer laser comprising:
  a laser chamber adapted to be filled with a laser gas;
  a front mirror disposed in front of the laser chamber for reflecting one part of a laser beam outputted from the laser chamber and transmitting another part of the laser beam;
  a beam expander disposed behind the laser chamber for expanding the laser beam outputted from the laser chamber in a predetermined direction;
  a grating disposed behind the beam expander and having a plurality of grooves formed in a direction substantially perpendicular to a direction of beam expansion by the beam expander for selectively reflecting a laser beam having a desired wavelength among those of the laser beam expanded by the beam expander; and
  a window disposed on the laser chamber constructed and arranged such that the window makes Brewster's angle with respect to an optical axis of laser beam in a plane defined by the direction of beam expansion by the beam expander and the optical axis of the laser beam for converting the laser beam output from the laser chamber into a linear polarized light wave which is substantially parallel with the direction of beam expansion by the beam expander.

3. A narrow band excimer laser comprising:
  a laser chamber adapted to be filled with a laser gas;
  a front mirror disposed in front of the laser chamber for reflecting one part of a laser beam outputted from the laser chamber and transmitting another part of the laser beam;
  a beam expander comprising at least one prism disposed behind the laser chamber for expanding the laser beam outputted from the laser chamber in predetermined direction;
  a grating disposed behind the beam expander and having a plurality of grooves formed in a direction substantially perpendicular to a direction of beam expansion by the beam expander for selectively reflecting a laser beam having a desired wavelength among those of the laser beam expanded by the base expander, and
  a polarizing film provided on at least one face of at lest one prism constituting the beam expander for converting the laser beam outputted from the laser chamber into a linear polarized light wave which is substantially parallel with the direction of beam expansion by the beam expander.

4. A wavelength detecting apparatus used for a narrow band excimer laser which outputs a narrow band laser beam comprising:
  a reference light source for outputting a reference light having a known wavelength;
  means for splitting a laser beam of unknown wavelength outputted from a narrow band excimer laser into parts;
  a light mixing means for mixing one part of a laser beam outputted from a narrow band excimer laser and the reference light outputted from the reference light source;
  etalon means for receiving a mixed light mixed by the light mixing means;
  light condensing means for condensing light transmitting through the etalon means;
  light detecting means for detecting hot$_b$ a first interference fringe based on the laser beam of unknown wavelength outputted from the narrow band excimer laser and a second interference fringe based on the reference light outputted from the reference light source with the first and second interference fringes being formed by the light condensed by the light condensing means,
  said light detecting means being constructed and arranged to detect the absolute wavelength of the laser beam outputted from the narrow band excimer laser on the basis of the detected first interference fringe of the unknown wavelength laser beam and the second interference fringe of the known wavelength reference light source, thereby alleviating precise control of pressure and ambient temperature resulting in high accuracy of said detecting means.

5. The wavelength detecting apparatus according to claim 4 wherein the reference light source includes:
  reference laser oscillator means for generating the laser beam having the known wavelength.

6. The wavelength detecting apparatus according to claim 5 wherein the light mixing means comprises:
  first beam splitter means for separating a part of the laser beam outputted from the narrow band excimer laser;
  second beam splitter means for mixing the laser beam outputted from the reference laser oscillator and the laser beam separated by the first beam splitter means; and
  a concave lens disposed between the second beam splitter means and the etalon.

7. The wavelength detecting apparatus according to claim 5 wherein the light mixing means comprises:

first beam splitter means for separating a part of the laser beam outputted from the narrow band excimer laser;

second beam splitter means for mixing the laser beam outputted from the reference laser oscillator and the laser beam separated by the first beam splitter means; and a light diffusion plate disposed between the second beam splitter means and the etalon.

8. The wavelength detecting apparatus according to claim 5 wherein the light mixing means comprises:

beam splitter means for separating a part of the laser beam outputted from the narrow band excimer laser; and synthesizing type optical fiber means for receiving from a first input end the laser beam separated by the beam splitter means and receiving from a second input end the laser beam outputted from the reference laser oscillator and outputting therefrom a mixed beam of the received laser beams.

9. The wavelength detecting apparatus according to claim 4 wherein the reference light source comprises a lamp.

10. The wavelength detecting apparatus according to claim 9 wherein the light mixing means comprises:

first beam splitter means for separating a part of the laser beam outputted from the narrow band excimer laser;

a concave lens for receiving the laser beam separated by the first beam splitter means; and second beam splitter means for mixing an outputted light of the concave lens and the reference light generated from the lamp.

11. The wavelength detecting apparatus according to claim 10 further comprising;

first shutter means for opening and closing an optical path of the laser beam separated by the first beam splitter means; and second shutter means for opening and closing an optical path of the light outputted from the lamp.

12. The wavelength detecting apparatus according to claim 9 wherein the light mixing means comprises:

first beam splitter means for separating a part of the laser beam outputted from the narrow band excimer laser;

a light diffusion plate for receiving the laser beam separated by the first beam splitter means; and second beam splitter means for mixing outputted light of the light diffusion plate and the reference light generated from the lamp.

13. The wavelength detecting apparatus according to claim 9 wherein the light mixing means comprises:

first beam splitter means for separating a part of the laser beam outputted from the narrow band excimer laser;

an optical fiber for transmitting the laser beam separated by the first beam splitter means; and second beam splitter means for mixing the laser beam transmitted by the optical fiber and the reference light generated from the lamp.

14. The wavelength detecting apparatus according to claim 9 wherein the lamp is provided at an output side thereof with a filter for selecting only a light having a predetermined wavelength from the light generated by the lamp.

15. The wavelength detecting apparatus according to claim 4 wherein the light condensing means comprises an achromatic lens.

16. The wavelength detecting apparatus according to claim 4 wherein the light condensing means comprises a light condensing mirror for reflecting a light beam transmitted through the etalon into the light detecting means.

17. The wavelength detecting apparatus according to claim 16 wherein the light condensing mirror comprises a concave mirror.

18. The wavelength detecting apparatus according to claim 16 wherein the light condensing mirror comprises an eccentric parabolic mirror.

19. A wavelength detecting apparatus used for a narrow band excimer laser which outputs a narrow band laser beam comprising:

a reference light source for outputting a reference light having a known wavelength;

means for splitting a laser beam outputted from a narrow band excimer laser into parts;

light mixing means for mixing one part of the laser beam outputted from the narrow band excimer laser and the reference light outputted from the reference light source;

etalon means for receiving the light mixed by the light mixing means;

light condensing means for condensing light transmitting through the etalon means;

light detecting means for detecting at different times respectively a first interference fringe based on the laser beam outputted from the narrow band excimer laser and a second interference fringe based on the reference light outputted from the reference light source, the first and second interference fringes being formed by the light condensed by the light condensing means;

means for establishing a detection period of the first interference fringe which is longer than a detection period of the second interference fringe, and said detection period establishing means being constructed and arranged to detect the absolute wavelength of the laser beam outputted from the narrow band excimer laser on the basis of the detected first and second interference fringes.

* * * * *